United States Patent
Fang et al.

(10) Patent No.: US 7,170,130 B2
(45) Date of Patent: Jan. 30, 2007

(54) MEMORY CELL WITH REDUCED DIBL AND VSS RESISTANCE

(75) Inventors: Shenqing Fang, Fremont, CA (US); Kuo-Tung Chang, Saratoga, CA (US); Pavel Fastenko, Sunnyvale, CA (US); Zhigang Wang, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 265 days.

(21) Appl. No.: 10/915,771

(22) Filed: Aug. 11, 2004

(65) Prior Publication Data

US 2006/0035431 A1   Feb. 16, 2006

(51) Int. Cl.
    *H01L 29/788* (2006.01)
(52) U.S. Cl. ................. 257/316; 438/259; 257/E21.179
(58) Field of Classification Search ........ 438/257–267; 257/E21.179, 316–321
    See application file for complete search history.

(56) References Cited

U.S. PATENT DOCUMENTS

| 5,424,233 | A | 6/1995 | Yang et al. | |
| 5,502,321 | A | 3/1996 | Matsushita | |
| 6,635,532 | B2 * | 10/2003 | Song et al. | 438/259 |
| 6,759,709 | B1 * | 7/2004 | Shimizu | 257/315 |

| 2003/0181028 | A1 | 9/2003 | Yeap et al. |

FOREIGN PATENT DOCUMENTS

| EP | 0177 986 | 4/1986 |
| JP | 11067937 | 3/1999 |
| WO | WO 97/19472 | 5/1997 |

OTHER PUBLICATIONS

U.S. Appl. No. 10/762,445, filed Jan. 22, 2004 Fang et al.

* cited by examiner

*Primary Examiner*—Richard A. Booth
(74) *Attorney, Agent, or Firm*—Farjami & Farjami LLP

(57) ABSTRACT

According to one exemplary embodiment, a method for fabricating a floating gate memory cell on substrate comprises a step of forming a spacer adjacent to a source sidewall of a stacked gate structure, where the stacked gate structure is situated over a channel region in substrate. The method further comprises forming a high energy implant doped region adjacent to the spacer in the source region of substrate. The method further comprises forming a recess in a source region of the substrate, where the recess has a sidewall, a bottom, and a depth, and where the sidewall of the recess is situated adjacent to a source of the floating gate memory cell. According to this exemplary embodiment, the spacer causes the source to have a reduced lateral straggle and diffusion in the channel region, which causes a reduction in drain induced barrier lowering (DIBL) in the floating gate memory cell.

5 Claims, 9 Drawing Sheets

MEMORY CELL WITH REDUCED DIBL AND VSS RESISTANCE

TECHNICAL FIELD

The present invention is generally in the field of semiconductor fabrication. More particularly, the present invention is in the field of floating gate memory device fabrication.

BACKGROUND ART

High performance flash memory devices, such as NOR-type flash memory devices, require high density and high operating speed as the device dimensions are scaled down. A low resistance Vss line, which connects source regions of flash memory cells situated between word lines, is used to reduce memory core cell size, improve circuit density, and increase flash memory device performance.

In a conventional flash memory process flow, the Vss line can be formed by heavily doping the semiconductor substrate by using a Vss connection implant. In order to achieve a desirably low Vss resistance, a sufficient amount and a sufficient depth of doping are required along the Vss line in the semiconductor substrate. However, by introducing the amount and depth of doping required to sufficiently lower Vss resistance, the effective channel length can be undesirably reduced. As a result, a short channel effect known as drain induced barrier lowering (DIBL) can undesirably increase in a flash memory cell, such as a floating gate flash memory cell. By way of background, DIBL occurs when a voltage inputted on the drain of the memory cell, such as a floating gate flash memory cell, causes the drain's electric field to directly affect the memory cell's source. As a result of DIBL, the memory cell's threshold voltage decreases, which detrimentally affects memory cell performance.

Thus, there is a need in the art for a floating gate flash memory cell, such as a NOR-type floating gate flash memory cell, having reduced DIBL and a sufficiently low Vss resistance.

SUMMARY

The present invention is directed to a memory cell with reduced DIBL and Vss resistance. The present invention addresses and resolves the need in the art for a floating gate flash memory cell, such as a NOR-type floating gate flash memory cell, having reduced DIBL and sufficiently low Vss resistance.

According to one exemplary embodiment, a method for fabricating a floating gate memory cell on a substrate comprises a step of forming a spacer adjacent to a source sidewall of a stacked gate structure, where the stacked gate structure is situated over a channel region in the substrate. The floating gate memory cell can be a NOR-type floating gate flash memory cell, for example. The method further comprises forming a high energy implant doped region adjacent to the spacer in a source region of the substrate. The method further comprises forming a recess in the source region of the substrate, where the recess has a sidewall, a bottom, and a depth, and where the sidewall of the recess is situated adjacent to a source of the floating gate memory cell. The spacer can be removed during formation of the recess. The depth of the recess can be, for example, between approximately 100.0 Angstroms and approximately 500.0 Angstroms.

According to this exemplary embodiment, the spacer causes the source to have a reduced lateral straggle and diffusion in the channel region. The reduced lateral straggle and diffusion of the source in the channel region causes a reduction in drain induced barrier lowering (DIBL) in the floating gate memory cell. The method further comprises forming a Vss connection region under the bottom of the recess and under the source, where the Vss connection region is connected to the source. The recess allows a resistance of the Vss connection region to be decreased without increasing DIBL in the floating gate memory cell. Other features and advantages of the present invention will become more readily apparent to those of ordinary skill in the art after reviewing the following detailed description and accompanying drawings.

DETAILED DESCRIPTION OF THE INVENTION

The present invention is directed to a memory cell with reduced DIBL and Vss resistance. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

Figure 1:
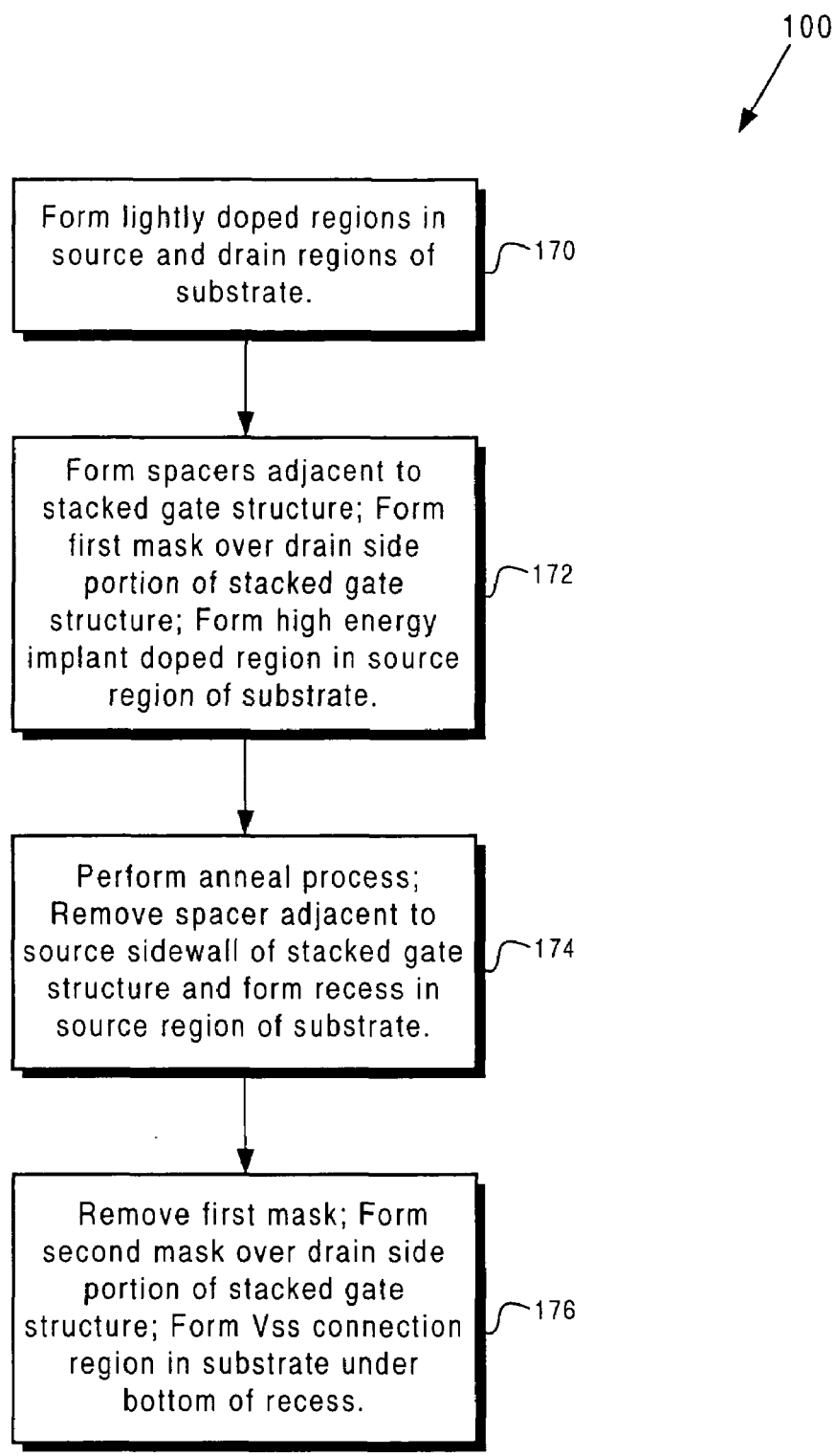
FIG. 1 is a flowchart corresponding to exemplary method steps according to one embodiment of the present invention.

The drawings in the present application and their accompanying detailed description are directed to merely exemplary embodiments of the invention. To maintain brevity, other embodiments of the present invention are not specifi- FIG. 1 shows a flowchart illustrating an exemplary method for forming a floating gate flash memory cell including a recessed Vss implant region and a source having reduced source straggle and diffusion according to one embodiment of the present invention. Certain details and features have been left out of flowchart 100 that are apparent to a person of ordinary skill in the art. For example, a step may consist of one or more substeps or may involve specialized equipment or materials, as known in the art. Steps 170, 172, 174, and 176 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 170, includes a stacked gate structure of a floating gate memory cell situated on a substrate. The stacked gate further includes a tunnel oxide layer situated on the substrate, a floating gate situated on the tunnel oxide layer, an Oxide-Nitride-Oxide (ONO) stack situated on the floating gate, and a control gate situated on the ONO stack. Structures 270, 272, 274, and 276 in FIGS. 2A, 2B, 2C, and 2D illustrate the result of performing, on a structure including a stacked gate structure situated on a substrate discussed above, steps 170, 172, 174, and 176 of flowchart 100, respectively.

Figure 2A:
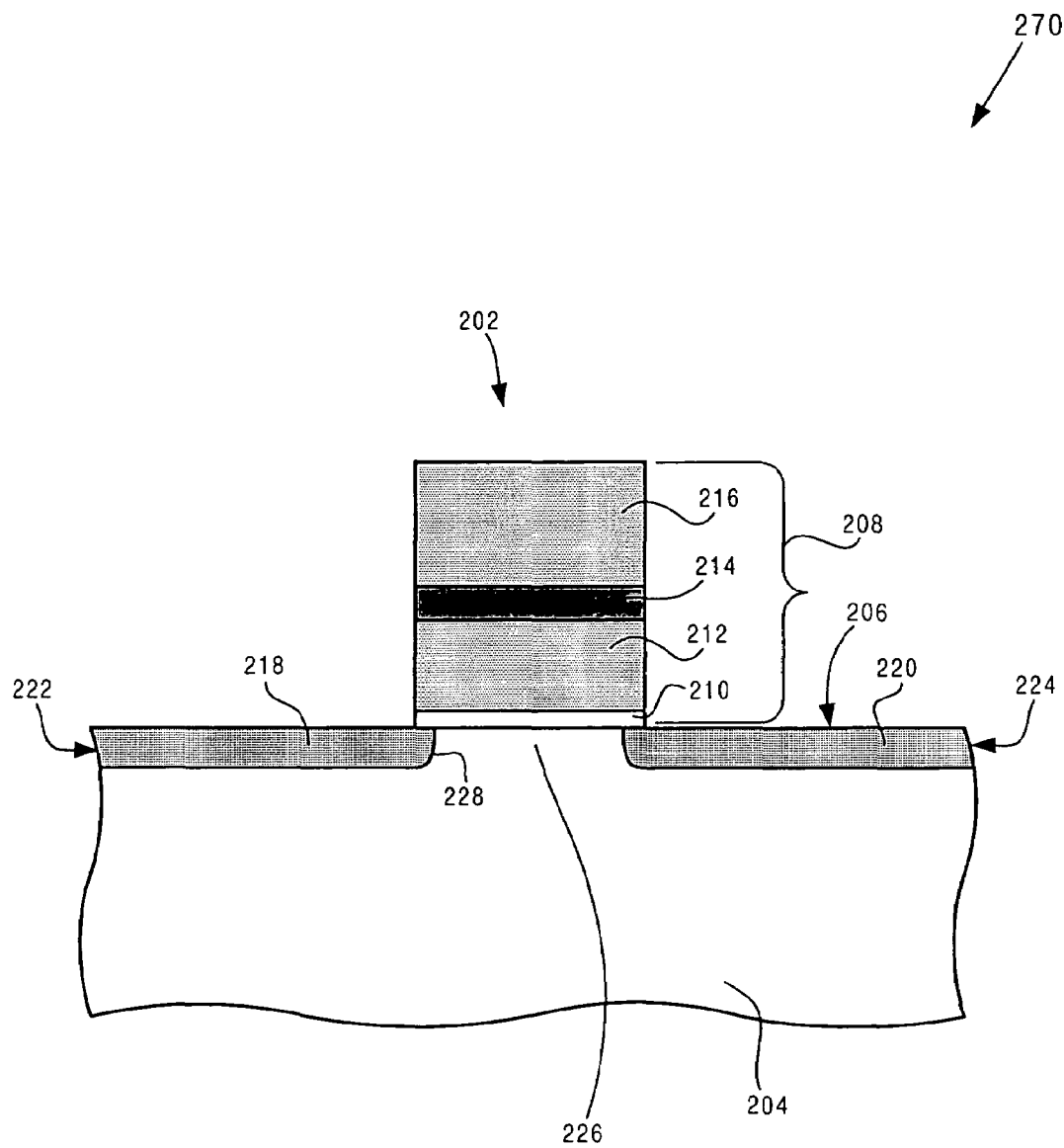
FIG. 2A illustrates a cross-sectional view of a portion of a wafer processed according to an embodiment of the invention, corresponding to certain steps of the flowchart in FIG. 1.

Referring now to step 170 in FIG. 1 and structure 270 in FIG. 2A, at step 170 of flowchart 100, low energy implant doped region 218 is formed in source region 222 and low energy implant doped region 220 is formed in drain region 224. Low energy implant doped regions 218 and 220 can be formed by utilizing a low energy/low dose implant to appropriately implant a desired amount of an appropriate N type dopant in source region 222 and drain region 224. Low energy implant doped region 218 has lateral straggle and diffusion edge 228, which extends toward channel region 226 under stacked gate structure 208. In one embodiment, low energy implant doped region 218 is formed in source region 222 at step 170 and low energy implant doped region 220 is formed in drain region 224 after formation of a Vss connection region at a subsequent step in the process. Structure 270 can comprise a flash memory device, such as a NOR-type flash memory device. By way of background, a NOR-type flash memory device is a flash memory device configured in a NOR architecture, where source regions are typically connected by Vss lines running parallel to word lines. Floating gate memory cell 202 can be a floating gate flash memory cell, such as a NOR-type floating gate flash memory cell. Low energy implant doped regions 218 and 220 provide a connection to channel 226, which is situated in substrate 204 under stacked gate structure 208.

Also shown in FIG. 2A, stacked gate structure 208 is situated on substrate 204 and includes tunnel oxide layer 210, floating gate 212, ONO stack 214, and control gate 216. Further shown in FIG. 2A, tunnel oxide layer 210 is situated over channel region 226 on top surface 206 of substrate 204 and can comprise thermally grown tunnel oxide. Also shown in FIG. 2A, floating gate 212 is situated on tunnel oxide layer 210 and can comprise polycrystalline silicon (also referred to as polysilicon), which can be deposited in a low pressure chemical vapor deposition (LPCVD) process or other appropriate processes. Further shown in FIG. 2A, ONO stack 214 is situated on floating gate 212. ONO stack 214 is a three-layer structure, which comprise a bottom layer of silicon oxide, a middle layer of silicon nitride, and a top layer of silicon oxide, which can be sequentially deposited by LPVCD process or thermally grown. Also shown in FIG. 2A, control gate 216 is situated on ONO stack 214 and can comprise polysilicon, which can be formed on ONO stack 214 by utilizing an LPCVD process or other appropriate processes. Further shown in FIG. 2A, source region 222 and drain region 224 are situated in substrate 204 adjacent to stacked gate structure 208 and can be formed in a manner known in the art. Referring to FIG. 2A, the result of step 170 of flowchart 100 is illustrated by structure 270.

Figure 2B:
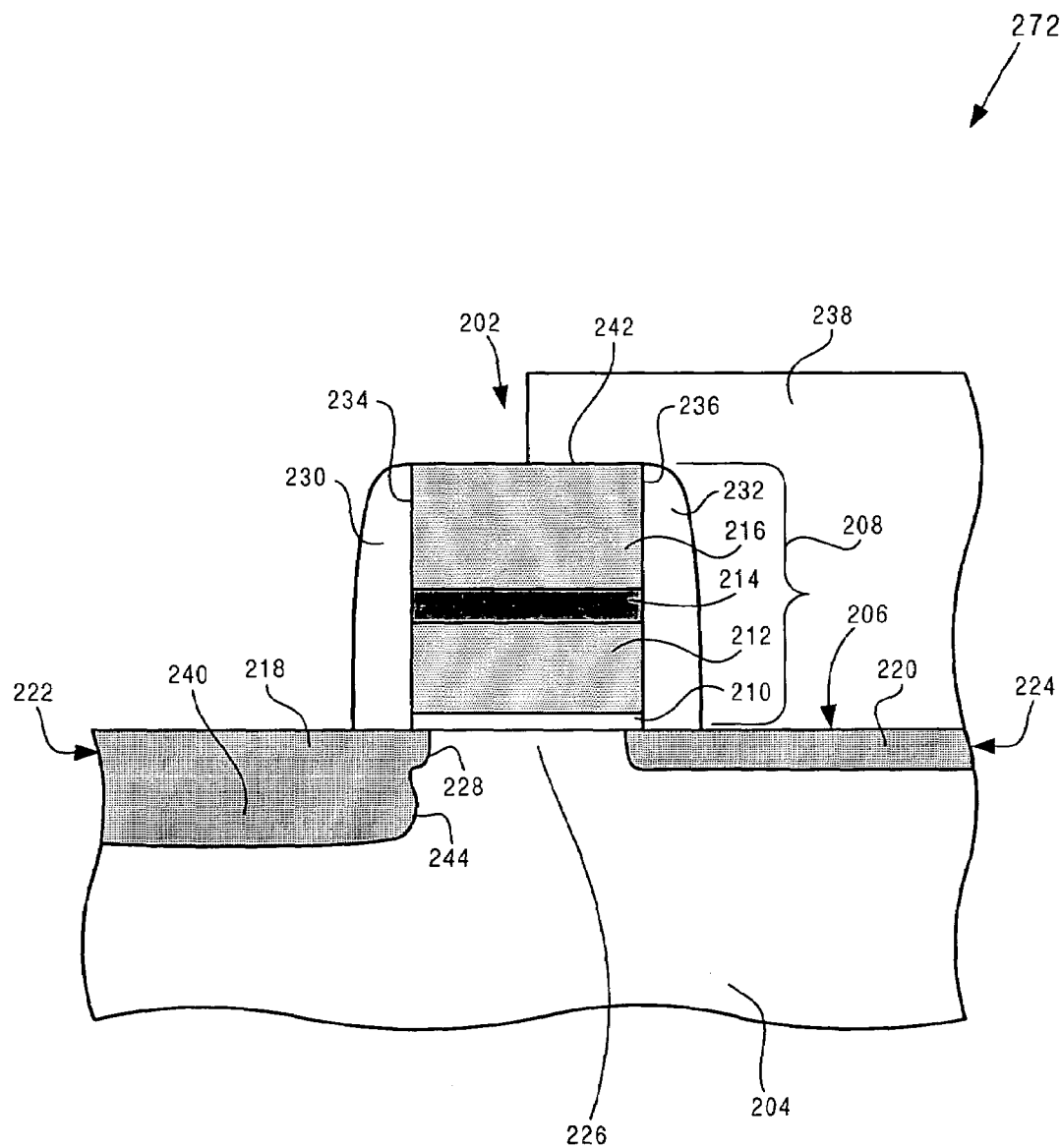
FIG. 2B illustrates a cross-sectional view of a portion of a wafer processed according to an embodiment of the invention, corresponding to certain steps of the flowchart in FIG. 1.

Continuing with step 172 in FIG. 1 and structure 272 in FIG. 2B, at step 172 of flowchart 100, spacers 230 and 232 are formed adjacent to respective source and drain sidewalls 234 and 236 of stacked gate structure 208, mask 238 is formed over drain side portion 242 of stacked gate structure 208 and over drain region 224, and high energy implant doped region 240 is formed in source region 222 of substrate 204. In the present embodiment, spacers 230 and 232, which are situated adjacent to respective source and drain sidewalls 234 and 236 of stacked gate structure 208, can comprise silicon oxide. In other embodiments, spacers 230 and 232 can comprise other appropriate dielectric materials. Spacers 230 and 232 can be formed by depositing a conformal layer of silicon oxide over stacked gate structure by using a LPCVD process or other appropriate processes. The deposited conformal layer of silicon oxide can be "etched back" by using an appropriate etch process to form spacers 230 and 232.

As shown in FIG. 2B, mask 238 is situated over drain side portion 242 of stacked gate structure 208 and over drain region 224 of substrate 204. Mask 238 can be a self-aligned source (SAS) mask, which can be formed in a manner known in the art, and can comprise an appropriate masking material, such as photoresist. Also shown in FIG. 2B, high energy implant doped region 240 is situated in source region 222 and extends into low energy implant doped region 218. High energy implant doped region 240 includes lateral straggle and diffusion edge 244 and can be formed by using a high energy/high dose implant to appropriately implant a desired amount of an appropriate N type dopant in source region 222. Referring to FIG. 2B, the result of step 172 of flowchart 100 is illustrated by structure 272.

Figure 2C:
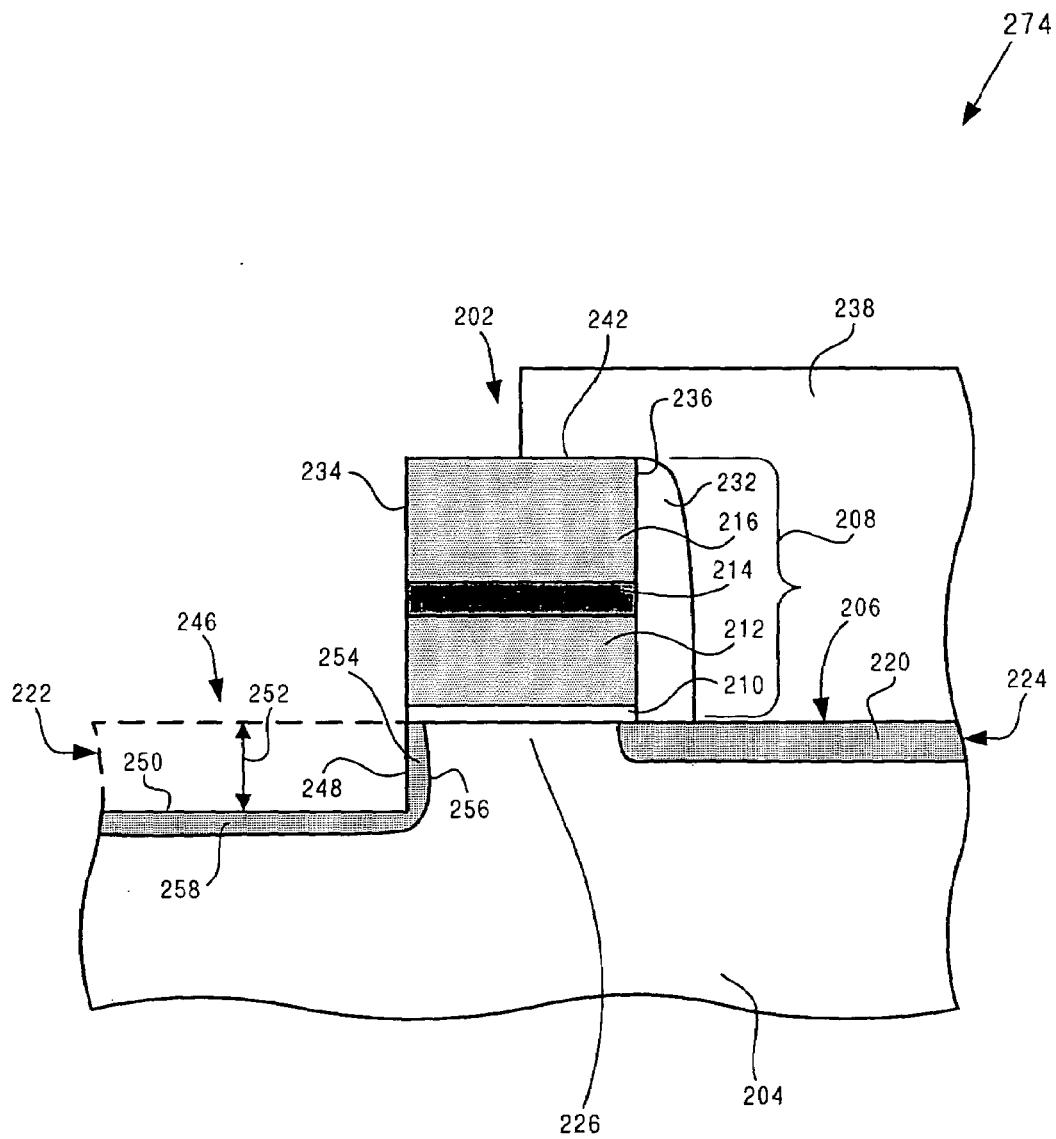
FIG. 2C illustrates a cross-sectional view of a portion of a wafer processed according to an embodiment of the invention, corresponding to certain steps of the flowchart in FIG. 1.

Continuing with step 174 in FIG. 1 and structure 274 in FIG. 2C, at step 174 of flowchart 100, an anneal process is performed, spacer 230 is removed, and recess 246 is formed in source region 222 of substrate 204. During the anneal process, substrate 204 is heated to a sufficient temperature such that damage caused by the high energy implant utilized to form high energy implant doped region 240 is repaired. The anneal process allows the high energy implant used to form high energy implant doped region 240 to be reduced in energy to reduce lateral straggle and diffusion of high energy implant doped region 240 under stacked gate structure 208. The anneal process can also be utilized to smooth out lateral straggle and diffusion edges 228 and 244 (shown in FIG. 2B) of low energy implant doped region 218 and high energy implant doped region 240, respectively. In one embodiment, the anneal process is not utilized. In such embodiment, the energy of the high energy implant can be appropriately increased to ensure that lateral straggle and diffusion edge 244 (shown in FIG. 2B) extends an appropriate distance, as measured in a direction parallel to top surface 206 of substrate 204, beyond source sidewall 234 of stacked gate structure 208.

Also shown in FIG. 2C, spacer 234 is removed and recess 246 is formed in source region 222. Spacer 234 can be removed by utilizing a SAS etch process, which can also be utilized to form recess 246 by etching away substantial portions of high energy implant doped region 240 and low energy implant doped region 218 in substrate 204. Recess 246 has sidewall 248, bottom 250, and depth 252, which indicates the distance between bottom 250 of recess 246 and top surface 206 of substrate 204. By way of example, depth 252 can be between approximately 100.0 Angstroms and approximately 500.0 Angstroms. In the present embodiment, sidewall 248 of recess 246 can be substantially perpendicular to top surface 206 of substrate 204. In another embodiment, sidewall 248 of recess 246 may form an angle other than approximately 90.0° with respect to top surface 206 of substrate 204. During the SAS etch process, oxide is also removed from shallow trench isolation (STI) regions (not shown in any of the figures) to expose trenches in preparation for a subsequent Vss connection implant.

Also shown in FIG. 2C, after substantial portions of high energy implant doped region 240 and low energy implant doped region 218 (shown in FIG. 2B) have been removed, remaining portions of high energy implant doped region 240 and low energy implant doped region 218 form source 254 of floating gate memory cell 202. As shown in FIG. 2C, source 254, which has source junction 256, is situated adjacent to sidewall 248 of recess 246 and also situated under stacked gate structure 208. Further shown in FIG. 2C, portion 258 of high energy implant doped region 240 also remains after formation of recess 246 and is situated under bottom 250 of recess 246. Portion 258 of high energy implant doped region 240 is connected to source 254 and ensures a sufficient connection between source 254 and a Vss connection region formed in a subsequent process step. Referring to FIG. 2C, the result of step 174 of flowchart 100 is illustrated by structure 274.

Figure 2D:
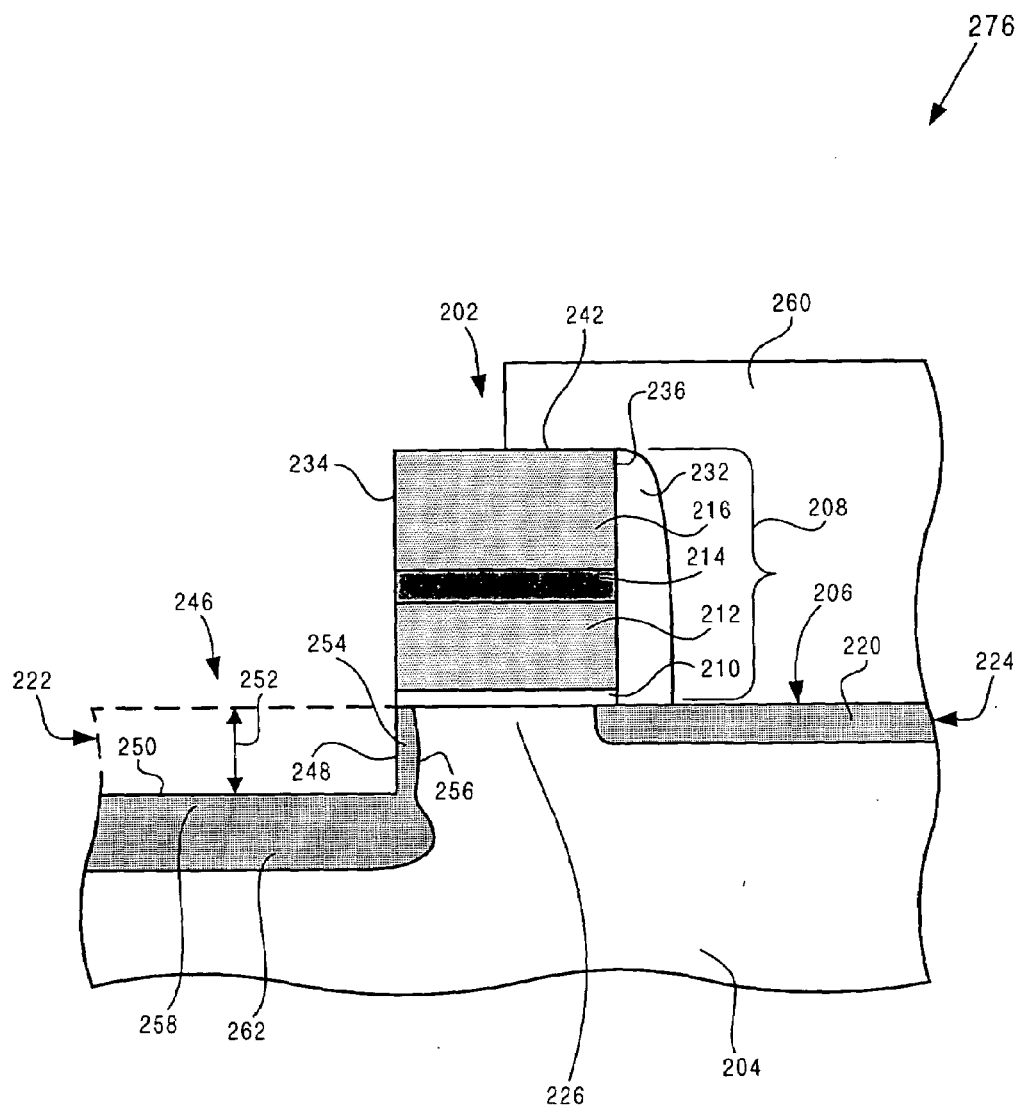
FIG. 2D illustrates a cross-sectional view of a portion of a wafer processed according to an embodiment of the invention, corresponding to certain steps of the flowchart in FIG. 1.

Referring now to step 176 in FIG. 1 and structure 276 in FIG. 2D, at step 176 of flowchart 100, mask 238 (shown in FIG. 2C) is removed, mask 260 is for med over drain side portion 242 of stacked gate structure 208 and over drain region 224, and Vss connection region 262 is formed in substrate 204 under bottom 250 of recess 246. Mask 238 can be removed in a manner known in the art. As shown in FIG. 2D, mask 260 is situated over drain side portion 242 of stacked gate structure 208 and over drain region 224 and can be a SAS mask. Mask 260 is substantially similar in formation and composition to mask 238.

Also shown in FIG. 2D, Vss connection region 262 is situated under bottom 250 of recess 246 and under source 254 of floating gate memory cell 202. Vss connection region 262 extends into portion 258 of high energy implant doped region 240 (shown in FIG. 2B), which connects Vss connection region 262 to source 254 of floating gate memory cell 202. Vss connection region 262 is a heavily doped region and can be formed by using a Vss connection implant, which is a high energy/high dose implant comprising an appropriate N type dopant. Vss connection region 262 forms a common source line, which is utilized to connect source regions of other floating gate memory cells (not shown in any of the figures) to a common ground. Vss connection region 262 has a resistance, which is also referred to as a "Vss resistance" in the present application.

In the embodiment of the present invention in FIG. 1, spacer 230 is utilized to reduce the lateral straggle and diffusion of high energy implant doped region 240 and, consequently, to reduce the lateral straggle and diffusion of source 254 into channel region 226, which prevents an undesirable reduction in the effective channel length of channel region 226. Further, in the embodiment of the present invention in FIG. 1 recess 246 is utilized to situated Vss connection region 262 below source 254, which reduces lateral straggle and diffusion of source 254 into channel region 226. Thus, by reducing lateral straggle and diffusion of source 254 into channel region 226, the embodiment of the present invention in FIG. 1 advantageously achieves a reduction in DIBL in floating gate memory cell 202. Additionally, by utilizing spacer 230 to reduce lateral straggle and diffusion of high energy implant doped region 240 into channel region 226, the high energy implant used to form high energy implant doped region 240 can have a sufficient energy and dose to ensure an adequate connection between source 254 and Vss connection region 262 while enabling Vss connection region 262 to be situated at a desirable distance below top surface 206 of substrate 204.

Additionally, in the embodiment of the present invention in FIG. 1, by utilizing recess 246 to situate Vss connection region 262 below top surface 206 of substrate 204 and below source 254, the resistance of Vss connection region 238, i.e. Vss resistance, can be decreased by heavily doping Vss connection region 262 without causing an undesirably increase in DIBL.

Figure 3:
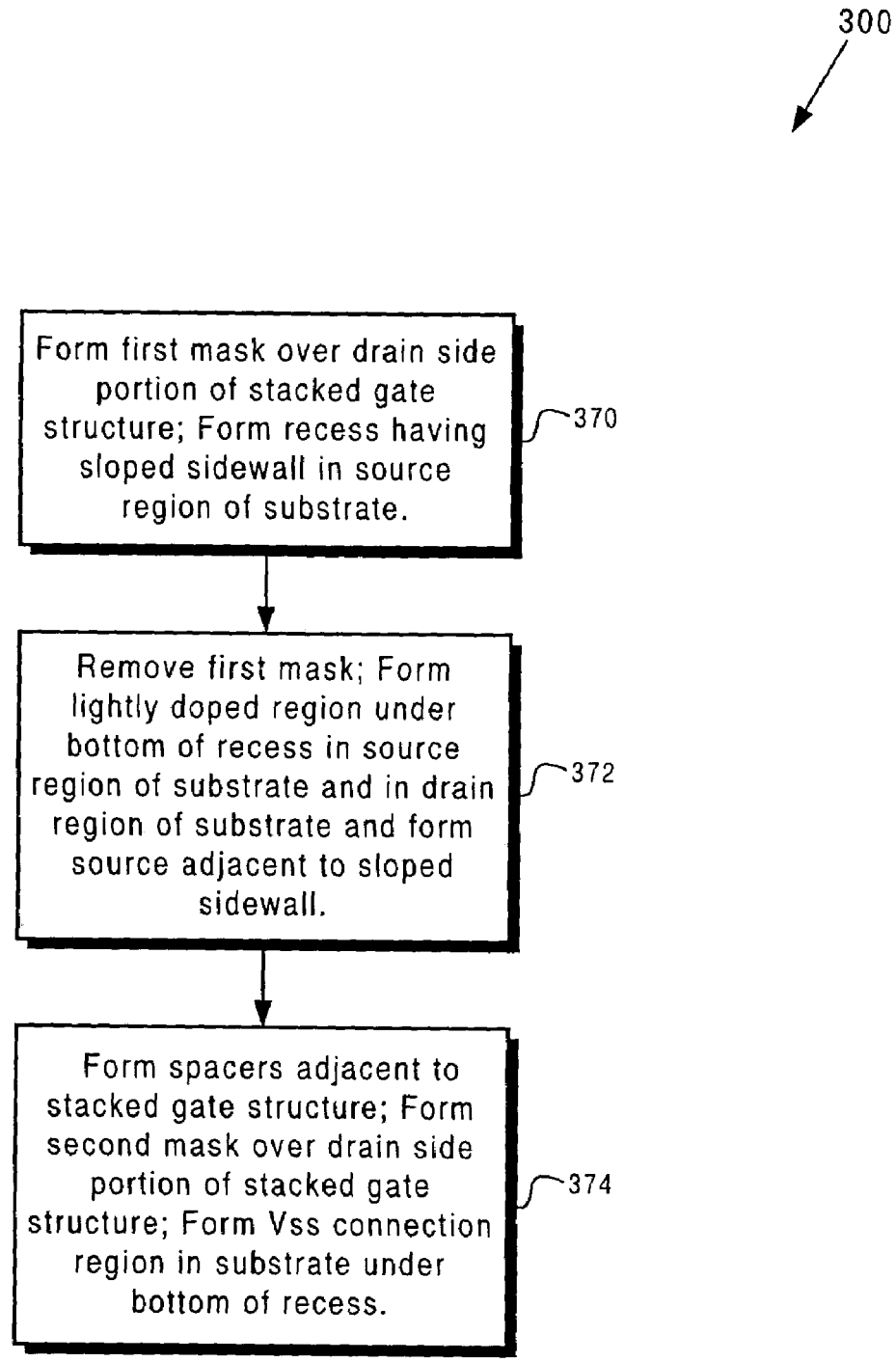
FIG. 3 is a flowchart corresponding to exemplary method steps according to one embodiment of the present invention.

FIG. 3 shows a flowchart illustrating an exemplary method for forming a floating gate flash memory cell including a recessed Vss implant region and a source having reduced source diffusion according to one embodiment of the present invention. Certain details and features have been left out of flowchart 300 that are apparent to a person of ordinary skill in the art. For example, a step may consist of one or more substeps or may involve specialized equipment or materials, as known in the art. Steps 370, 372, and 374 indicated in flowchart 300 are sufficient to describe one embodiment of the present invention, other embodiments of the invention may utilize steps different from those shown in flowchart 300. It is noted that the processing steps shown in flowchart 300 are performed on a wafer, which, prior to step 370, includes a stacked gate structure of a floating gate memory cell situated on a substrate which includes source and drain regions situated adjacent to the stacked gate structure. The stacked gate further includes a tunnel oxide layer situated on the substrate, a floating gate situated on the tunnel oxide layer, an ONO stack situated on the floating gate, and a control gate situated on the ONO stack. Structures 470, 472, and 474 in FIGS. 4A, 4B, and 4C illustrate the result of performing, on a structure including a stacked gate structure situated on a substrate discussed above, steps 370, 372, and 374 of flowchart 300, respectively.

Figure 4A:
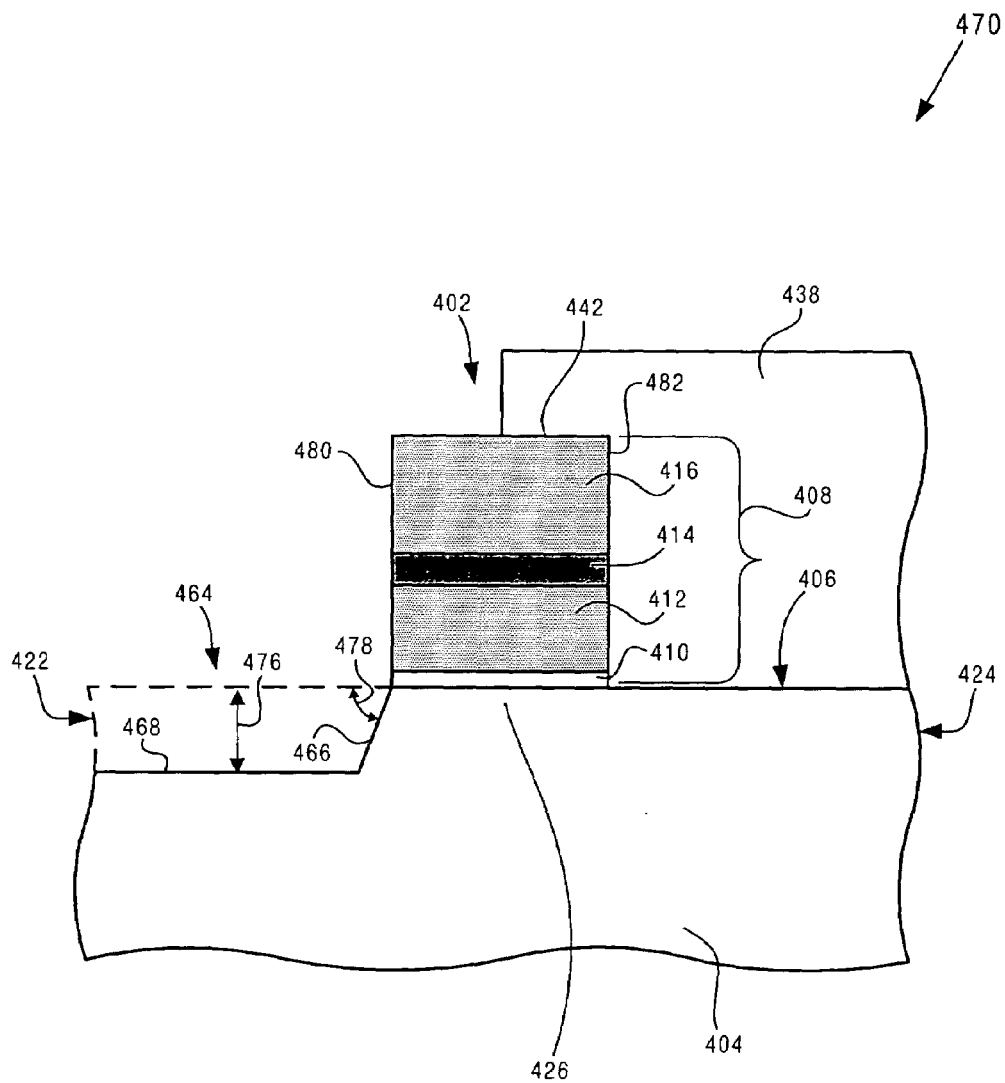
FIG. 4A illustrates a cross-sectional view of a portion of a wafer processed according to an embodiment of the invention, corresponding to certain steps of the flowchart in FIG. 3.
Figure 4B:
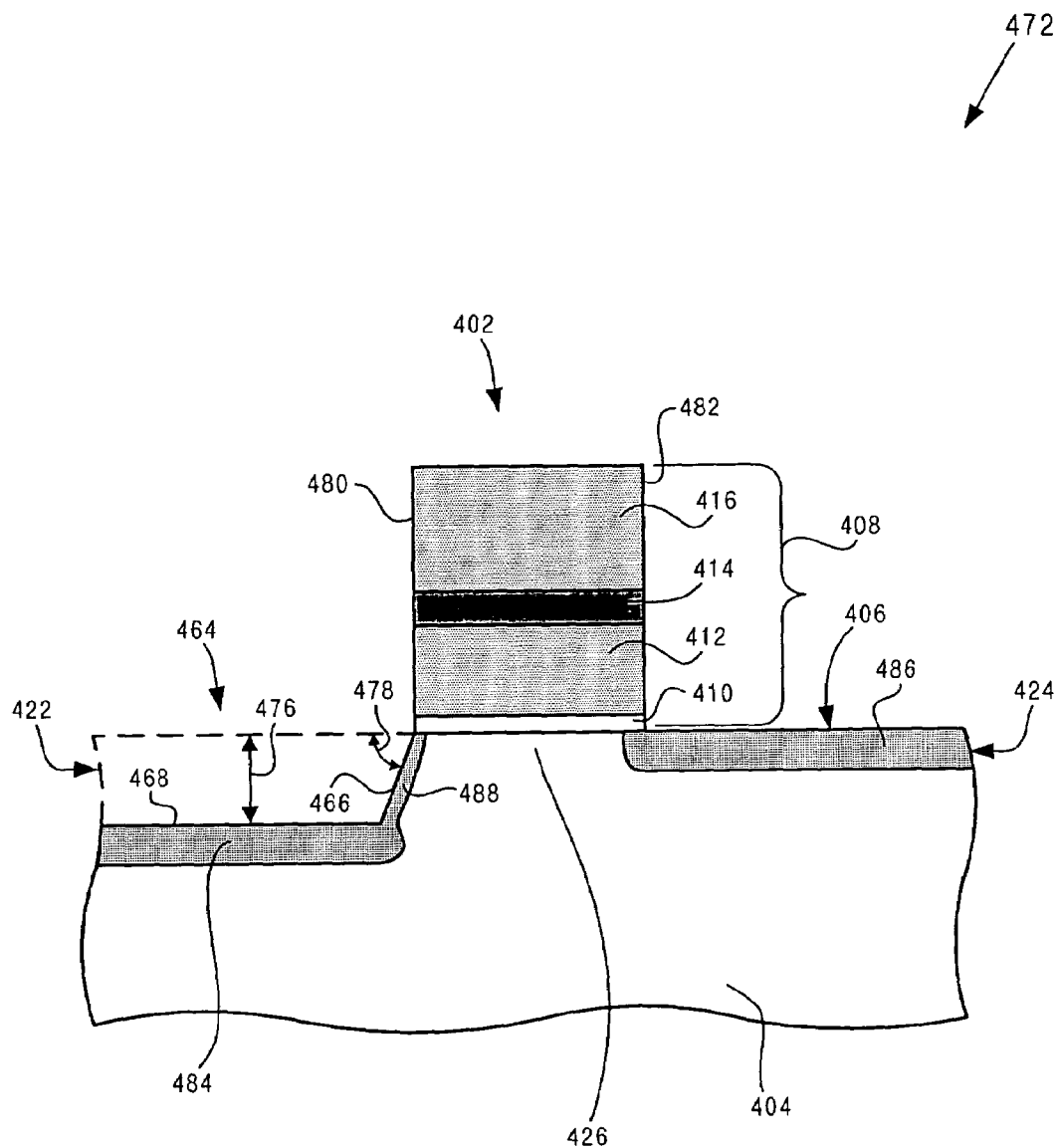
FIG. 4B illustrates a cross-sectional view of a portion of a wafer processed according to an embodiment of the invention, corresponding to certain steps of the flowchart in FIG. 3.
Figure 4C:
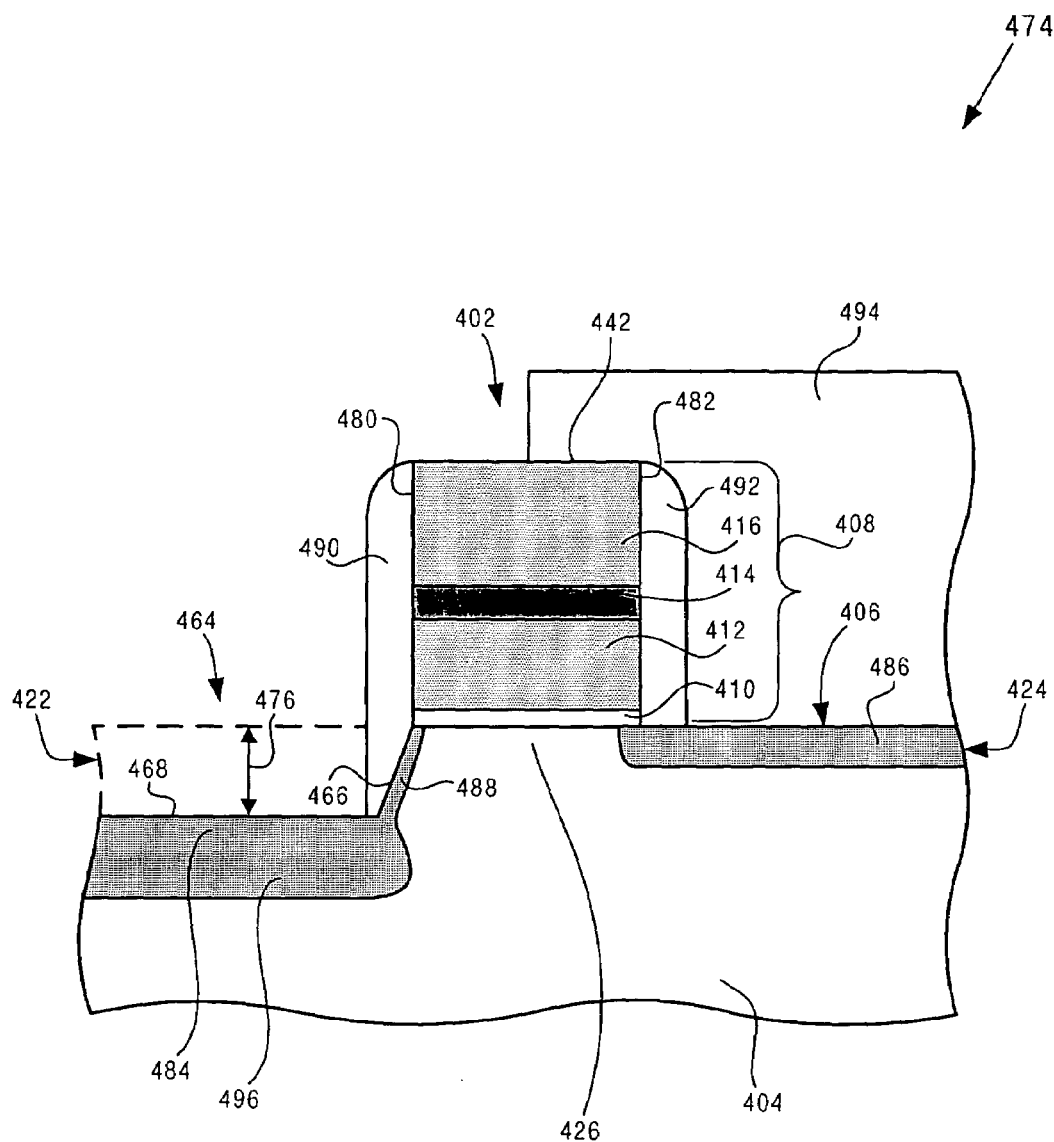
FIG. 4C illustrates a cross-sectional view of a portion of a wafer processed according to an embodiment of the invention, corresponding to certain steps of the flowchart in FIG. 3.

Referring now to step 370 in FIG. 3 and structure 470 in FIG. 4A, at step 370 of flowchart 300, mask 438 is formed over drain side portion 442 of stacked gate structure 408 and over drain region 424 of substrate 404 and recess 464 is formed in source region 422 of substrate 404. In FIG. 4A, floating gate memory cell 402, substrate 404, top surface 406, stacked gate structure 408, tunnel oxide layer 410, floating gate 412, ONO stack 414, control gate 416, source region 422, drain region 424, and channel region 426 in structure 470 correspond, respectively, to floating gate memory cell 202, substrate 204, top surface 206, stacked gate structure 208, tunnel oxide layer 210, floating gate 212, ONO stack 214, control gate 216, source region 222, drain region 224, and channel region 26 in structure 270 in FIG. 2A.

As shown in FIG. 4A, mask 438 is situated over drain side portion 442 of stacked gate structure 408 and situated over drain region 424 of substrate 404. Mask 438 is substantially similar in composition and formation to mask 238 in FIG. 2B. Similar to structure 270 in FIG. 2A, structure 470 can comprise a flash memory device, such as a NOR-type flash memory device. Also shown in FIG. 4A, recess 464 is situated in source region 422 and has sloped sidewall 466, bottom 468, and depth 476, which indicates the distance between bottom 468 and top surface 406 of substrate 404. By way of example, depth 476 can be between approximately 100.0 Angstroms and approximately 500.0 Angstroms. Sloped sidewall 466 forms angle 478 with respect to top surface 406 of substrate 404. By way of example, angle 478 can be between approximately 85.0 degrees and approximately 89.0 degrees. Recess 464 can be formed by utilizing a SAS etch process to etch away a portion of substrate 404 in source region 422. During the SAS etch process, oxide is also removed from shallow trench isolation (STI) regions (not shown in any of the figures) to expose trenches in preparation for a subsequent Vss connection implant.

Also shown in FIG. 4A, stacked gate structure 408 is situated on substrate 404 and includes tunnel oxide layer 410, floating gate 412, ONO stack 414, and control gate 416. Further shown in FIG. 4A, tunnel oxide layer 410 is situated over channel region 426 on top surface 406 of substrate 404, floating gate 412 is situated on tunnel oxide layer 410, ONO stack 414 is situated on floating gate 412, and control gate 216 is situated on ONO stack 414. Also shown in FIG. 4A, source region 422 and drain region 424 are situated in substrate 404 adjacent to source sidewall 480 and drain sidewall 482 of stacked gate structure 408, respectively. Referring to FIG. 4A, the result of step 370 of flowchart 300 is illustrated by structure 470.

Continuing with step 372 in FIG. 3 and structure 472 in FIG. 4B, at step 372 of flowchart 300, mask 438 is removed, lightly doped regions 484 and 486 are formed in source region 422 and drain region 424, respectively, and source 488 is formed adjacent to sloped sidewall 466 of recess 464. Mask 438 can be removed by utilizing an appropriate etch process as known in the art. As shown in FIG. 4B, lightly doped region 484 is situated under bottom 468 of recess 464 and lightly doped region 486 is situated in drain region 424. In one embodiment, lightly doped region 484 is formed in source region 422 at step 372 of flowchart 300 and lightly doped region 486 is formed in drain region 424 after formation of a Vss connection region at a subsequent step in the process. Also shown in FIG. 4B, source 488 is situated adjacent to sloped sidewall 466 of recess 464 and comprises a lightly doped region. Lightly doped regions 484 and 486 and source 488 can be formed by utilizing a low energy/low dose implant to appropriately implant a desired amount of an appropriate N type dopant in source region 422 and drain region 424. Referring to FIG. 4B, the result of step 372 of flowchart 300 is illustrated by structure 472.

Continuing with step 374 in FIG. 3 and structure 474 in FIG. 4C, at step 374 of flowchart 300, spacers 490 and 492 are formed adjacent to stacked gate structure 408, mask 494 is formed over drain side portion 442 of stacked gate structure 408 and drain region 424, and Vss connection region 496 is formed in substrate 404 under bottom 468 of recess 464. As shown in FIG. 4C, mask 494 is situated over drain side 442 of stacked gate structure 408 and is substantially similar in composition and formation as mask 438. Also shown in FIG. 4C, spacer 490 is situated adjacent to source sidewall 480 of stacked gate structure 408 and situated adjacent to sloped sidewall 466 of recess 464 and spacer 492 is situated adjacent to drain sidewall 482 of stacked gate structure 408. Spacer 490 extends to bottom 468 of recess 464. Spacers 490 and 492 can comprise silicon oxide and can be formed by depositing a conformal layer of silicon oxide over stacked gate structure 408 by using a LPCVD process or other appropriate processes. The deposited conformal layer of silicon oxide can be "etched back" by using an appropriate etch process to form spacers 490 and 492.

Further shown in FIG. 4C, Vss connection region 496 is situated under bottom 468 of recess 464 and situated under source 488. Vss connection region 496 extends into lightly doped region 484, which connects Vss connection region 496 to source 488 of floating gate memory cell 402. Vss connection region 496 is substantially similar in composition and formation to Vss connection region 262 in FIG. 2D. Similar to Vss connection region 262 in FIG. 2D, Vss connection region 496 forms a common source line, which is utilized to connect source regions of other floating gate memory cells (not shown in any of the figures) to a common ground. Vss connection region 496 has a substantially similar resistance to Vss connection region 262 in FIG. 2D. Referring to FIG. 4C, the result of step 374 of flowchart 300 is illustrated by structure 474.

In the embodiment of the present invention in FIG. 3, by forming recess 464 having sloped sidewall 466, a low energy/low dose implant can be utilized to form source 488, which is situated adjacent to sloped sidewall 466, and lightly doped region 484, which is connected to source 488. Also, by utilizing spacer 490 to protect source 488 from the high energy/high dose implant utilized to form Vss connection region 496 and utilizing recess 464 to form Vss connection 496 below source 488, the embodiment of the present invention in FIG. 3 advantageously reduces lateral straggle and diffusion of source 488 into channel region 426. By reducing lateral straggle and diffusion of source 488 into channel region 426, the embodiment of the present invention in FIG. 3 advantageously achieves a reduction in DIBL in floating gate memory cell 402. Additionally, in the embodiment of the present invention in FIG. 3, by utilizing recess 464 to situated Vss connection region 496 below top surface 406 of substrate 404 and below source 488 and utilizing spacer 490 to protect source 488, the resistance of Vss connection region 496, i.e. Vss resistance, can be decreased by heavily doping Vss connection region 496 without causing an undesirably increase in DIBL.

Thus, as discussed above, the embodiments of the present invention in FIGS. 1 and 3 advantageously a spacer and a recessed Vss connection region to achieve reduced DIBL and Vss resistance in a floating gate memory cell, such as a NOR-type floating gate flash memory cell.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a memory cell with reduced DIBL and Vss resistance has been described.

The invention claimed is:

1. A floating gate memory cell situated on a substrate, said floating gate memory cell comprising:

a stacked gate structure situated on said substrate, said stacked gate structure being situated over a channel region in said substrate;

a recess formed in said substrate adjacent to said stacked gate structure, said recess having a sloped sidewall, a bottom, and a depth;

a source of said floating gate memory cell situated adjacent to said sloped sidewall of said recess and under said stacked gate structure;

a spacer situated adjacent to said stacked gate structure and adjacent to said sloped sidewall of said recess, said spacer extending to said bottom of said recess;

a mask situated over a drain side of said stacked gate structure and over a drain region of said floating gate memory cell, wherein said mask is not situated over said recess;

wherein said spacer causes said source to have a reduced lateral straggle and diffusion in said channel region.

2. The floating gate memory cell of claim 1 further comprising a Vss connection region situated under said bottom of said recess and under said source, said Vss connection region being connected to said source.

3. The floating gate memory cell of claim 1 wherein said sloped sidewall of said recess forms an angle of between approximately 85.0 degrees and approximately 89.0 degrees with a top surface of said substrate.

4. The floating gate memory cell of claim 1 wherein said reduced lateral straggle and diffusion of said source causes a reduction in drain induced barrier lowering in said floating gate memory cell.

5. The floating gate memory cell of claim 1 wherein said depth of said recess is between approximately 100.0 Angstroms and approximately 500.0 Angstroms.

* * * * *